US012635075B2

(12) United States Patent (10) Patent No.: US 12,635,075 B2
Arai et al. (45) Date of Patent: May 19, 2026

(54) ELECTRONIC COMPONENT AND MANUFACTURING METHOD OF ELECTRONIC COMPONENT INCORPORATED SUBSTRATE

(71) Applicant: Taiyo Yuden Co., Ltd., Tokyo (JP)

(72) Inventors: Takayuki Arai, Tokyo (JP); Tomoo Kashiwa, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 240 days.

(21) Appl. No.: 18/619,348

(22) Filed: Mar. 28, 2024

(65) Prior Publication Data

US 2024/0334599 A1 Oct. 3, 2024

(30) Foreign Application Priority Data

Mar. 31, 2023 (JP) ................................. 2023-058119

(51) Int. Cl.
H05K 1/18 (2026.01)
H05K 1/11 (2006.01)
H05K 1/181 (2026.01)
(52) U.S. Cl.
CPC ............. H05K 1/111 (2013.01); H05K 1/181 (2013.01); H05K 2203/0361 (2013.01)
(58) Field of Classification Search
CPC ...................................................... H05K 1/181
See application file for complete search history.

(56) References Cited

U.S. PATENT DOCUMENTS

| | | | |
|---|---|---|---|
| 2014/0174800 A1* | 6/2014 | Chang .................... | H01G 4/228 |
| | | | 361/306.3 |
| 2014/0182907 A1* | 7/2014 | Lee ........................ | H01G 4/232 |
| | | | 174/258 |
| 2015/0099115 A1* | 4/2015 | Maeda .................. | H01F 27/255 |
| | | | 252/62.53 |
| 2016/0093438 A1* | 3/2016 | Sasabayashi ............ | H01G 4/12 |
| | | | 361/301.4 |
| 2018/0068788 A1* | 3/2018 | Kobayashi .......... | C23C 18/1279 |

FOREIGN PATENT DOCUMENTS

JP 2012-019247 1/2012

* cited by examiner

*Primary Examiner* — Sherman Ng
(74) *Attorney, Agent, or Firm* — CHIP LAW GROUP

(57) ABSTRACT

Provided is an electronic component including a base body, a first internal element, a first external electrode, and a second external electrode. The first external electrode has a first outer metal layer and a first inner metal layer that is provided between the first outer metal layer and the first internal element, the second external electrode has a second outer metal layer and a second inner metal layer that is provided between the second outer metal layer and the first internal element, and the first inner metal layer has a lower laser absorption rate than any of the first outer metal layer and the second outer metal layer, and the second inner metal layer has a lower laser absorption rate than any of the first outer metal layer and the second outer metal layer.

7 Claims, 9 Drawing Sheets

F I G . 3 E
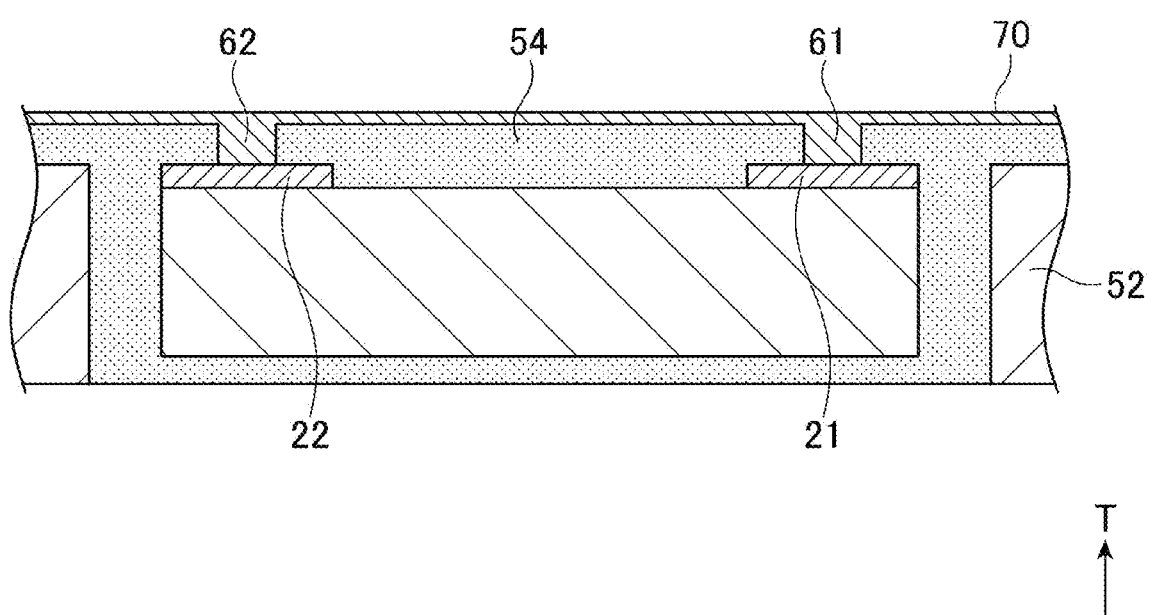
F I G . 3 F
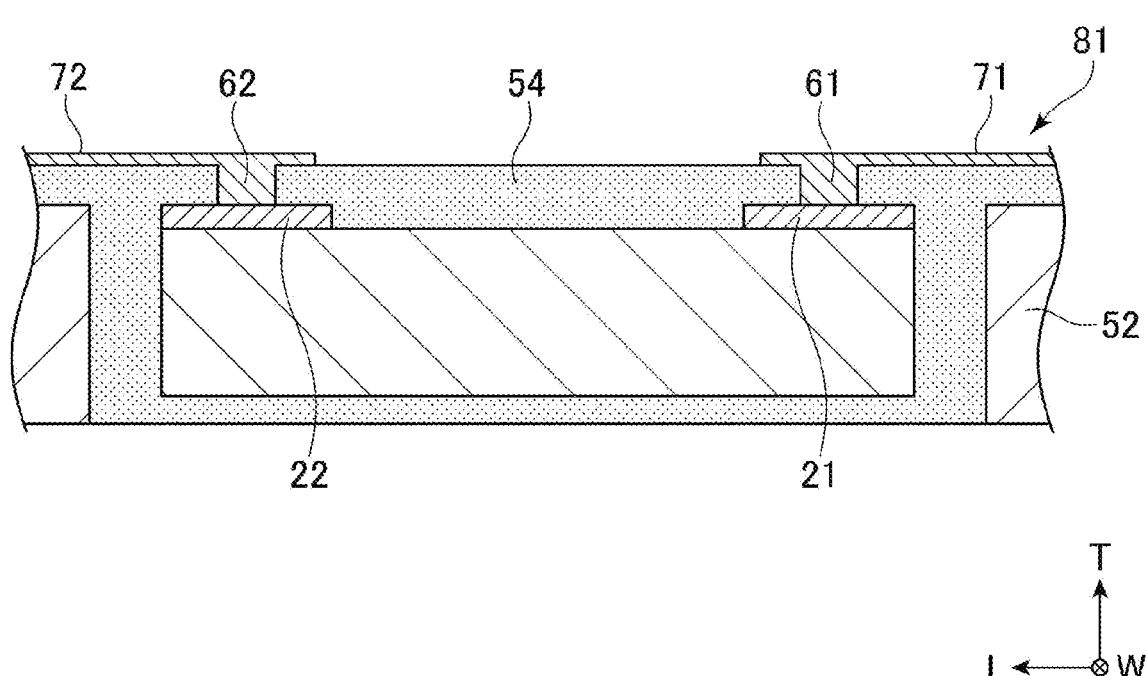

F I G . 4 A
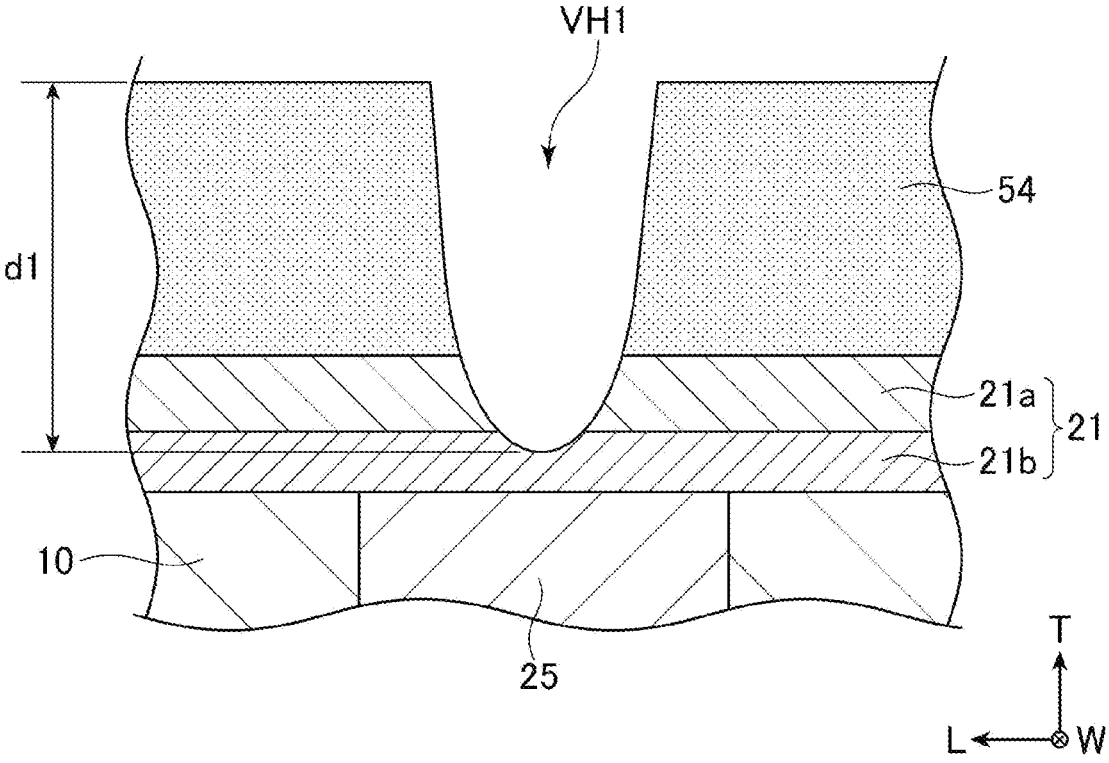
F I G . 4 B
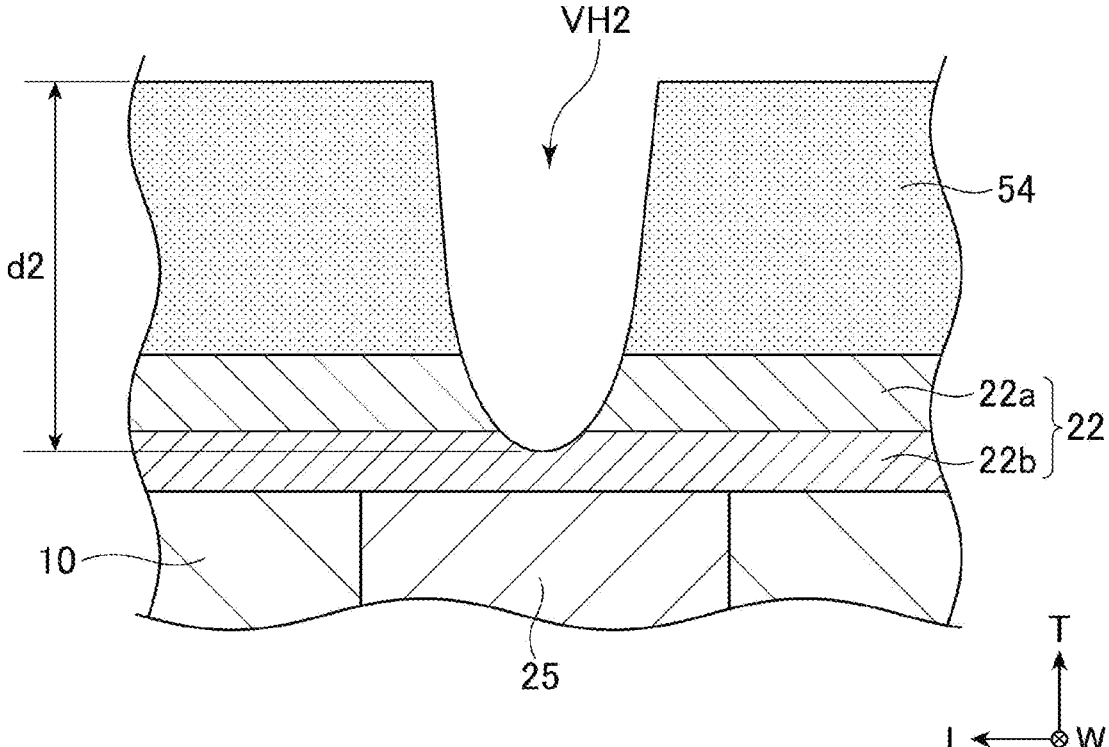

ELECTRONIC COMPONENT AND MANUFACTURING METHOD OF ELECTRONIC COMPONENT INCORPORATED SUBSTRATE

CROSS REFERENCE TO RELATED APPLICATIONS

This application claims priority benefit of Japanese Patent Application No. JP 2023-058119 filed in the Japan Patent Office on Mar. 31, 2023. Each of the above-referenced applications is hereby incorporated herein by reference in its entirety.

BACKGROUND

The disclosure of the specification relates primarily to an electronic component and a manufacturing method of an electronic component incorporated substrate.

An electronic component incorporated substrate in which an electronic component such as a capacitor, an inductor, or a resistor is embedded has been known. In the electronic component incorporated substrate, a wiring pattern is formed in an insulating layer, and an external electrode of an electronic component embedded in the insulating layer is connected to the wiring pattern through a via conductor. A past electronic component incorporated substrate is described in Japanese Patent Laid-open No. 2012-019247.

In a manufacturing process of the electronic component incorporated substrate, a via hole for exposing the external electrode is formed by irradiating the insulating layer in which the electronic component is embedded with a laser, and a via conductor is formed by applying plating treatment to the via hole.

SUMMARY

Since the electronic component is provided with a plurality of external electrodes, it is necessary to form a plurality of via holes in the insulating layer when the electronic component incorporated substrate is manufactured. In the past electronic component incorporated substrate, there is a problem that it is difficult to form each via hole with a uniform depth due to various factors such as a difference in the output of a laser with which each external electrode is irradiated, a difference in surface roughness between the external electrodes, and a difference in the density of the external electrodes. If the depth of the via hole is non-uniform, there is a possibility that the plating growth becomes insufficient in a deep via hole, and the connection between the via conductor and the external electrode or the connection between the via conductor and the wiring pattern may become defective.

It is hence desirable to solve or alleviate at least some of the problems described above. Specifically, it is desirable to suppress non-uniformity in the depths of via holes formed by laser irradiation. The various technologies disclosed in the specification may be collectively referred to as "the present technology."

Other achievements to be provided by the present technology will be clarified throughout the description of the whole specification. The technology disclosed in the specification may solve problems that are grasped from other than the description in the column of "SUMMARY." In the case where the working effect of an embodiment is described in the specification, the problem of the technology corresponding to the embodiment can be grasped from the working effect.

An electronic component according to one aspect of the present technology includes a base body, a first internal element provided inside the base body, a first external electrode provided on the base body, and a second external electrode provided on the base body so as to be separated from the first external electrode. The first external electrode and the second external electrode are electrically connected to the first internal element. The first external electrode has a first outer metal layer and a first inner metal layer. The first inner metal layer is provided between the first outer metal layer and the first internal element. The second external electrode has a second outer metal layer and a second inner metal layer. The second inner metal layer is provided between the second outer metal layer and the first internal element. In one aspect, the first inner metal layer has a lower laser absorption rate than any of the first outer metal layer and the second outer metal layer. In one embodiment, the second inner metal layer has a lower laser absorption rate than any of the first outer metal layer and the second outer metal layer.

According to one aspect of the technology disclosed in the specification, it is possible to suppress non-uniformity in the depths of via holes formed by laser irradiation.

BRIEF DESCRIPTION OF THE DRAWINGS

FIG. 3E is a diagram for schematically depicting a part of the process for manufacturing the electronic component incorporated substrate according to the embodiment;

FIG. 3F is a diagram for schematically depicting a part of the process for manufacturing the electronic component incorporated substrate according to the embodiment;

FIG. 4A is a cross-sectional view for depicting a first external electrode of the electronic component perforated by a laser;

FIG. 4B is a cross-sectional view for depicting a second external electrode of the electronic component perforated by a laser;

DETAILED DESCRIPTION OF THE PREFERRED EMBODIMENTS

Figure 1:
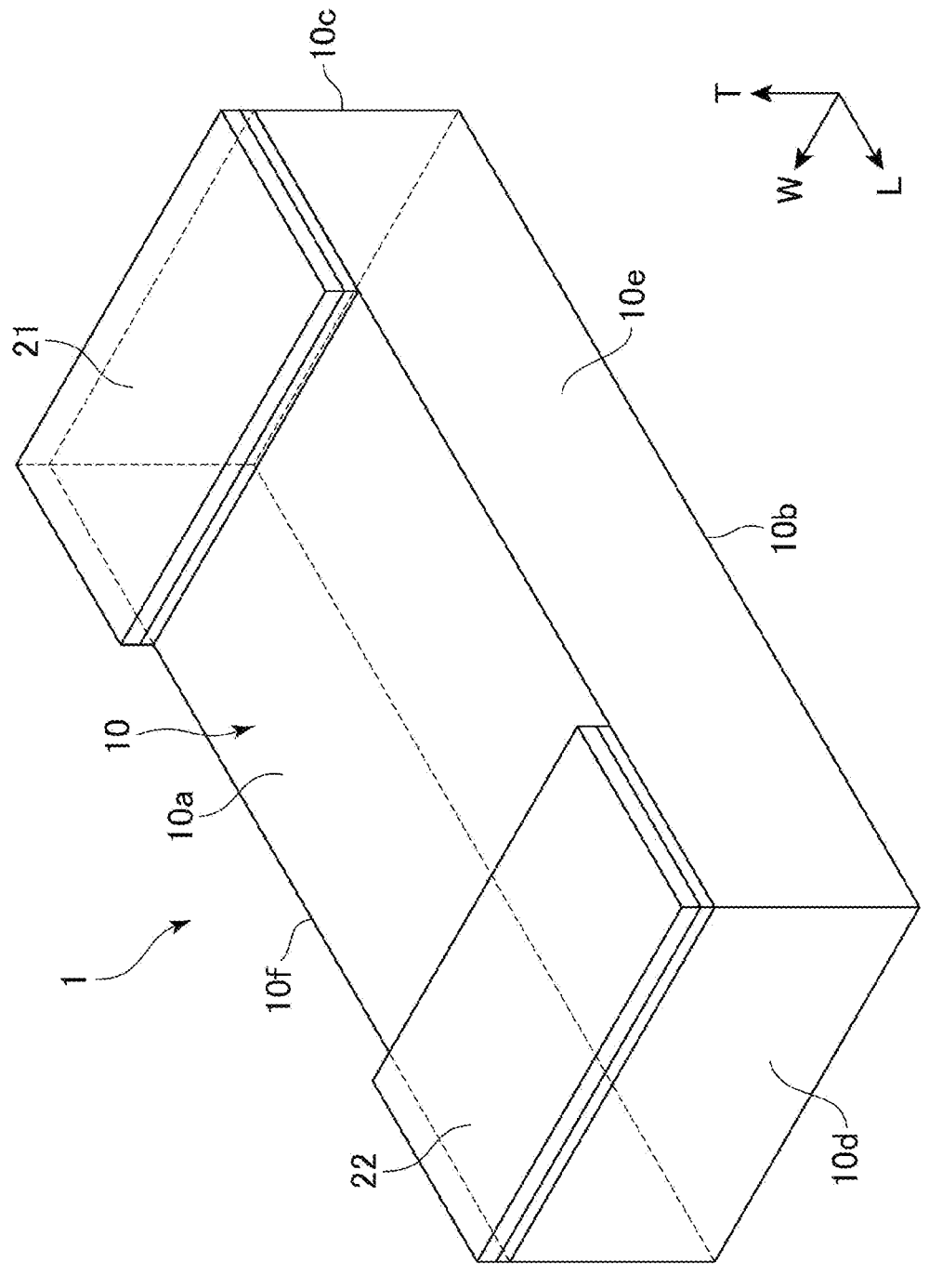
FIG. 1 is a perspective view for schematically depicting an electronic component according to an embodiment.

Hereinafter, various embodiments of the present technology will be described by appropriately referring to the drawings. Constitutional elements common in a plurality of drawings are assigned with the same or similar signs throughout the plurality of drawings. It should be noted that each drawing is not necessarily drawn with a precise scale for the convenience of explanation. The embodiments to be described below do not necessarily limit the technology according to claims. The elements described in the following embodiments may not necessarily be essential to the solving means of the technology.

1 First Embodiment 1-1 Basic Structure of Electronic Component 1

Figure 2:
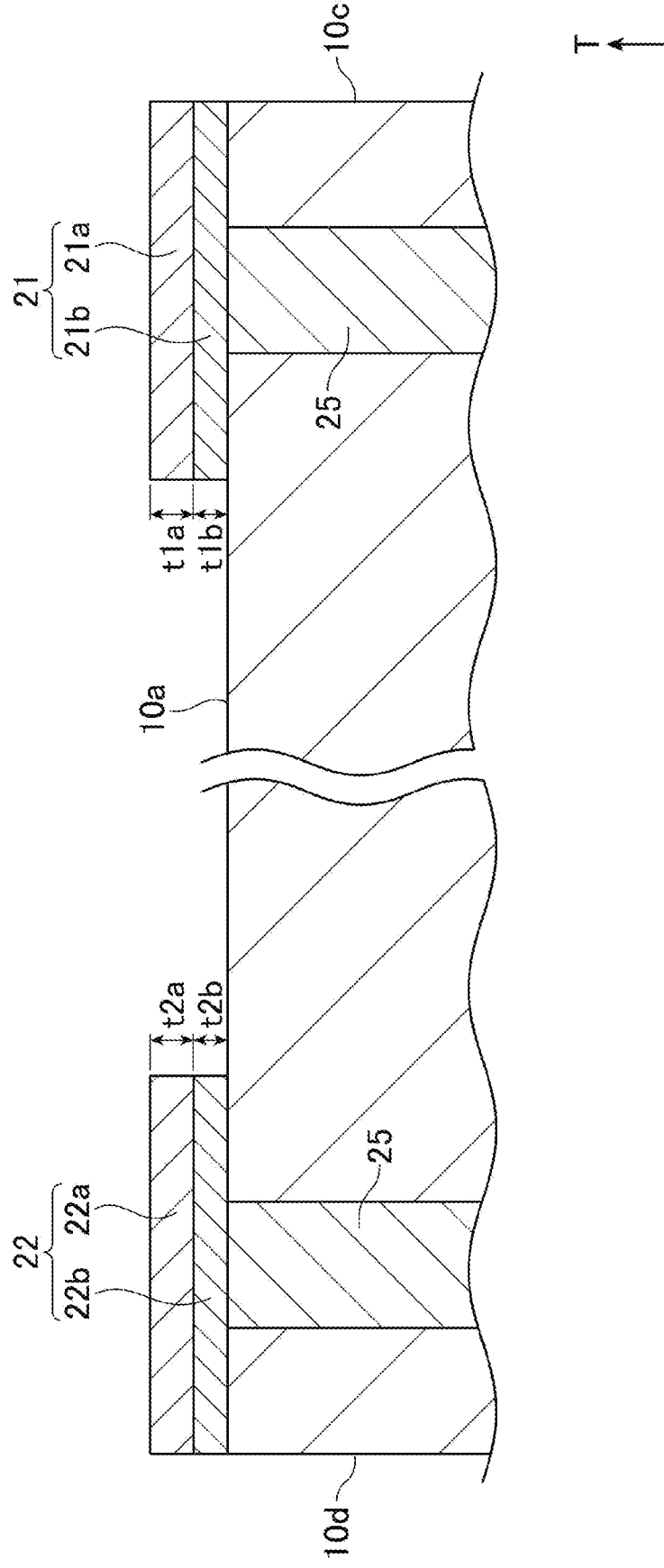
FIG. 2 is a cross-sectional view for depicting an enlarged portion of a cross section of the electronic component of FIG. 1 cut along a plane parallel to the LT plane.

Various embodiments disclosed in the specification relate to an electronic component incorporated into an electronic component incorporated substrate. Referring to FIG. 1 and FIG. 2, an electronic component 1 according to a first embodiment of the present technology will be described. FIG. 1 is a perspective view for schematically depicting the electronic component 1, and FIG. 2 is a schematic cross-sectional view for depicting an enlarged portion of a cross section of the electronic component 1 cut along the LT plane. FIG. 1 and FIG. 2 depict the electronic component 1 before being incorporated into a substrate. The incorporation of the electronic component 1 into the substrate will be described later.

The electronic component 1 is a given electronic component that can be incorporated into an electronic component incorporated substrate. The electronic component 1 may be a passive element such as an inductor, a capacitor, or a resistor, or an active element such as a semiconductor integrated circuit (IC).

As depicted in the drawings, the electronic component 1 includes an insulator 10, an internal element 25 provided inside the insulator 10, a first external electrode 21 provided on the surface of the insulator 10, and a second external electrode 22 provided on the surface of the insulator 10 at a position separated from the first external electrode 21. The first external electrode 21 is electrically connected to one end of the internal element 25, and the second external electrode 22 is electrically connected to the other end of the internal element 25.

The internal element 25 can take various shapes according to the type of electronic component 1. In the case where the electronic component 1 is an inductor, the internal element 25 is a coil conductor that produces inductance. For example, the coil conductor is wound around the coil axis by only a predetermined turn. One end and the other end of the coil conductor are connected to the first external electrode 21 and the second external electrode, respectively. In the case where the electronic component 1 is an inductor, the insulator 10 is a magnetic body including a magnetic material such as ferrite. The insulator may be a powder magnetic body configured by combining a plurality of soft magnetic metal particles.

In the case where the electronic component 1 is a capacitor, the insulator 10 is a dielectric including a sintered body of a ceramic material such as $BaTiO_3$. In the case where the electronic component 1 is a capacitor, the internal element 25 includes a first internal electrode layer and a second internal electrode layer arranged by sandwiching a dielectric layer configuring the dielectric. The first internal electrode layer is electrically connected to the first external electrode 21, and the second internal electrode layer is electrically connected to the second external electrode 22. When a voltage is applied between the first external electrode 21 and the second external electrode, an electrostatic capacitance is generated between the first internal electrode layer and the second internal electrode layer.

In one aspect, the insulator 10 may be configured to have a rectangular parallelepiped shape. The "rectangular parallelepiped" or "rectangular parallelepiped shape" in the specification does not mean only the "rectangular parallelepiped" in the exact mathematical sense. The insulator 10 has an upper surface 10a, a lower surface 10b, a first end surface 10c, a second end surface 10d, a first side surface 10e, and a second side surface 10f. The outer surface of the insulator 10 is defined by these six surfaces. Each of the upper surface 10a, the lower surface 10b, the first end surface 10c, the second end surface 10d, the first side surface 10e, and the second side surface 10f may include two or more surfaces. In addition, each of the upper surface 10a, the lower surface 10b, the first end surface 10c, the second end surface 10d, the first side surface 10e, and the second side surface 10f may be a plane or a curved surface.

1-2 External Electrode

In one aspect, the first external electrode 21 and the second external electrode 22 are provided on the upper surface 10a of the insulator 10. Both the first external electrode 21 and the second external electrode 22 may be in contact with only the upper surface 10a of the outer surface of the insulator 10.

The first external electrode 21 has a first outer metal layer 21a and a first inner metal layer 21b. The first inner metal layer 21b is provided between the first outer metal layer 21a and one end of the internal element 25. In one aspect, the first outer metal layer 21a is in direct contact with the first inner metal layer 21b. In the illustrated embodiment, one end of the internal element 25 is exposed from the upper surface 10a of the insulator 10. In one aspect, the first inner metal layer 21b is directly connected to one end of the internal element 25 exposed from the upper surface 10a. At least a part of the first inner metal layer 21b may be embedded in the insulator 10.

The second external electrode 22 has a second outer metal layer 22a and a second inner metal layer 22b. The second inner metal layer 22b is provided between the second outer metal layer 22a and the other end of the internal element 25. In one aspect, the second outer metal layer 22a is in direct contact with the second inner metal layer 22b. In the illustrated embodiment, the other end of the internal element 25 is exposed from the upper surface 10a of the insulator 10. In one aspect, the second inner metal layer 22b is directly connected to the other end of the internal element 25 exposed from the upper surface 10a. At least a part of the second inner metal layer 22b may be embedded in the insulator 10.

In one aspect, the laser absorption rate of the first inner metal layer 21b is lower than those of both the first outer metal layer 21a and the second outer metal layer 22a. In one aspect, the laser absorption rate of the second inner metal layer 22b is lower than those of both the first outer metal layer 21a and the second outer metal layer 22a.

The main components of the metal layers include, for example, Ni, Cu, and Ag. In one aspect, the main component of the first inner metal layer 21b is a metal having a lower laser absorption rate than the main component of the first outer metal layer 21a and the main component of the second outer metal layer 22a. In one aspect, the main component of the second inner metal layer 22b is a metal having a lower laser absorption rate than the main component of the first outer metal layer 21a and the main component of the second outer metal layer 22a. For example, the main components of the first outer metal layer 21a and the second outer metal layer 22a are selected according to the wavelength of the laser wavelength used for metal machining. The laser wavelength is in the range of, for example, 0.5 to 15 μm. In the case where the first outer metal layer 21a and the second outer metal layer 22a contain Ni as a main component, the first inner metal layer 21b and the second inner metal layer 22b contain Cu or Ag as a main component. In addition, in the case where the first outer metal layer 21a and the second outer metal layer 22a contain Cu as a main component, the first inner metal layer 21b and the second inner metal layer 22b contain Ag as a main component. In the specification, a component contained by 50 wt % or more in each layer can be the main component of the layer. The first inner metal layer 21b and the second inner metal layer 22b contain 50 wt % or more of Ag, and the first outer metal layer 21a and the second outer metal layer 22a contain 50 wt % or more of Cu. At least one of the first inner metal layer 21b and the second inner metal layer 22b may contain, as a main component, a metal other than Ag having a lower laser absorption rate than Cu. The laser absorption rate means the absorption rate of a carbon dioxide gas laser with a wavelength of 1.064 μm or an yttrium aluminum garnet (YAG) laser with a wavelength of 10.6 μm, which is commonly used in the manufacture of the electronic component incorporated substrate. Since Ag has the property of easily reflecting irradiated electromagnetic waves, the metal layer having Ag as a main component hardly absorbs both the carbon dioxide gas laser and the YAG laser. It should be noted that a metal having a melting point higher than 500° C. is used as the main component of the first outer metal layer 21a and the second outer metal layer 22a. By using a metal having a melting point higher than 500° C. as the main component of the first outer metal layer 21a and the second outer metal layer 22a, the machining speed in laser machining can be suppressed, the machining accuracy by laser machining in the depth direction can be stabilized, and the shape can be maintained in machining (for example, it is possible to avoid flowing out after being dissolved).

In one aspect, the thickness (dimension in the T-axis direction) t1b of the first inner metal layer 21b is equal to or less than the thickness t1a of the first outer metal layer 21a. For example, the thickness t1b of the first inner metal layer 21b is 0.2 times or more and 1.0 times or less of the thickness t1a of the first outer metal layer 21a. In this case, since the thickness of the first outer metal layer 21a having a high laser absorption rate becomes larger, even if the thickness of the first external electrode 21 is large, laser machining can be performed up to the necessary depth in a short time. Similarly, in one aspect, the thickness t2b of the second inner metal layer 22b is equal to or less than the thickness t2a of the second outer metal layer 22a. For example, the thickness t2b of the second inner metal layer 22b is 0.2 times or more and 1.0 times or less of the thickness t2a of the second outer metal layer 22a. In this case, since the thickness of the first outer metal layer 21a having a high laser absorption rate becomes larger, even if the thickness of the second external electrode 22 is large, laser machining can be performed up to the necessary depth in a short time.

In another aspect, the thickness t1b of the first inner metal layer 21b is thicker than the thickness t1a of the first outer metal layer 21a. For example, the thickness t1b of the first inner metal layer 21b is larger than 1.0 times and 3.0 times or less of the thickness t1a of the first outer metal layer 21a. In this case, since the thickness of the first inner metal layer 21b having a low laser absorption rate becomes larger, the machining accuracy in the depth direction by laser machining can be more stabilized. Similarly, in one aspect, the thickness t2b of the second inner metal layer 22b is thicker than the thickness t2a of the second outer metal layer 22a. For example, the thickness t2b of the second inner metal layer 22b is larger than 1.0 times and 3.0 times or less of the thickness t2a of the second outer metal layer 22a. In this case, since the thickness of the second inner metal layer 22b having a low laser absorption rate becomes larger, the machining accuracy in the depth direction by laser machining can be more stabilized.

1-3 Manufacturing Method of Electronic Component Incorporated Substrate

Next, with reference to FIG. 3A to FIG. 3F, an example of a manufacturing method of an electronic component incorporated substrate incorporating the electronic component 1 will be described.

Figure 3A:
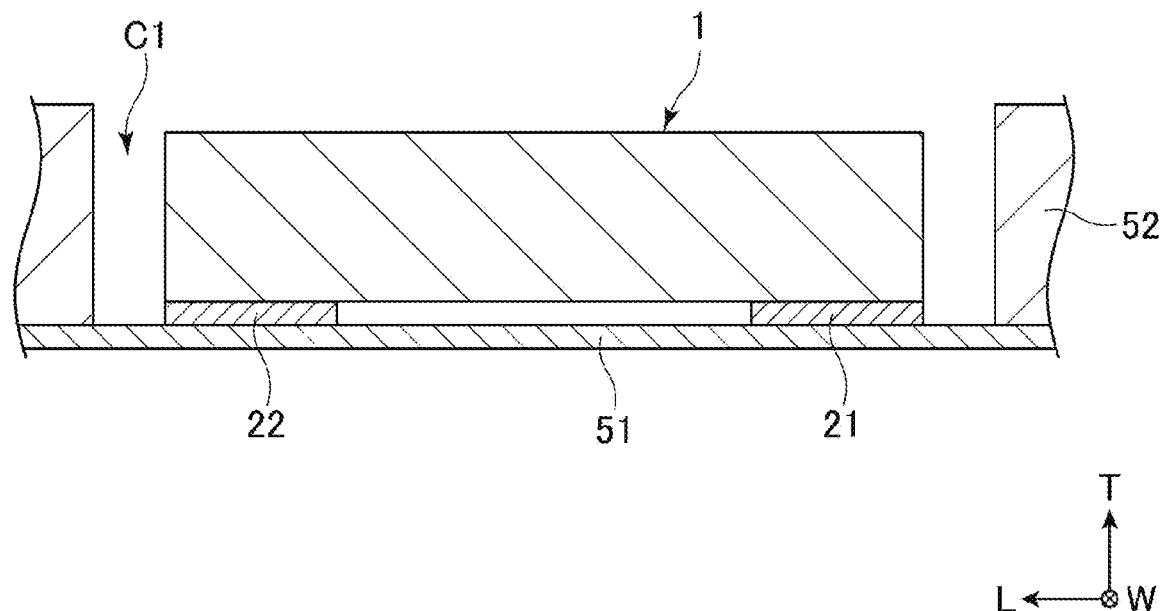
FIG. 3A is a diagram for schematically depicting a part of a process for manufacturing an electronic component incorporated substrate according to the embodiment.

First, as depicted in FIG. 3A, an insulating layer 52 is formed on a film 51, and a cavity C1 is formed in the insulating layer 52. Then, the electronic component 1 is placed in the cavity C1 such that the first external electrode 21 and the second external electrode 22 are in contact with the film 51. The film 51 is a film for temporarily attaching the electronic component 1 in the manufacturing process of the electronic component incorporated substrate. The insulating layer 52 is a part of a multilayer printed circuit board. Although not depicted in the drawing, a plurality of wiring patterns and via conductors connecting the wiring patterns to each other may be formed inside the insulating layer 52. The insulating layer 52 includes an insulating material such as glass epoxy. The material of the insulating layer 52 is not limited to glass epoxy and can include various materials suitable for the insulating layer of a multilayer printed circuit board.

Figure 3B:
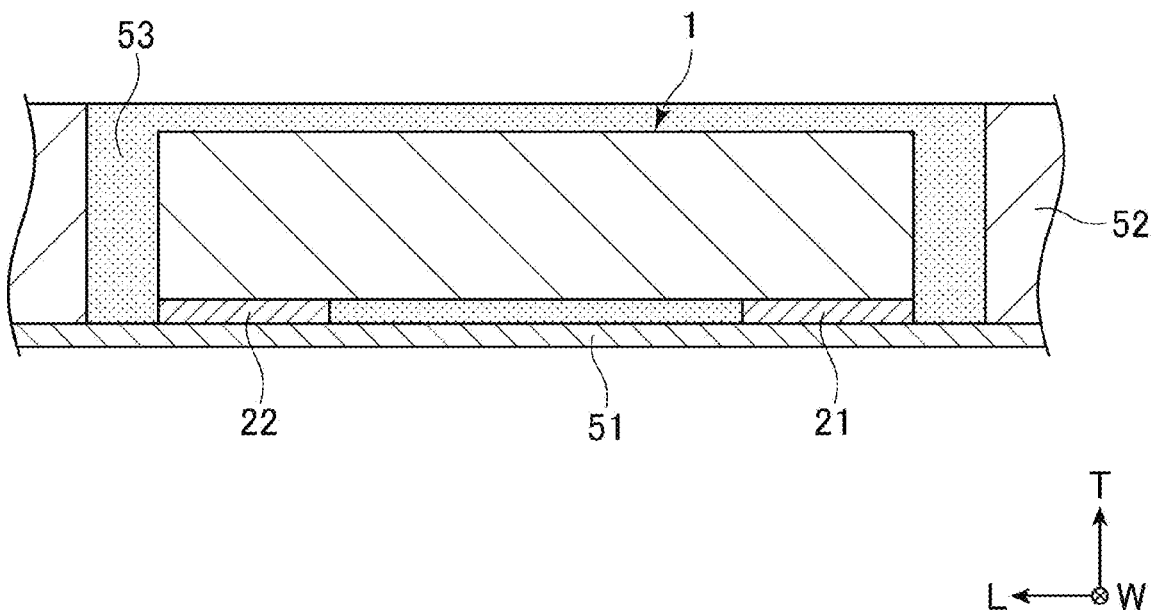
FIG. 3B is a diagram for schematically depicting a part of the process for manufacturing the electronic component incorporated substrate according to the embodiment.

Next, as depicted in FIG. 3B, a first resin layer 53 is formed so as to cover the electronic component 1 in the cavity C1 in which the electronic component 1 is placed. The first resin layer 53 includes, for example, a thermosetting resin. The first resin layer 53 may be formed by injecting an uncured thermosetting resin into the cavity C1 and heating and curing the injected thermosetting resin. In this way, an intermediate in which the electronic component 1 is sealed by the first resin layer 53 in the cavity C1 is produced.

Figure 3C:
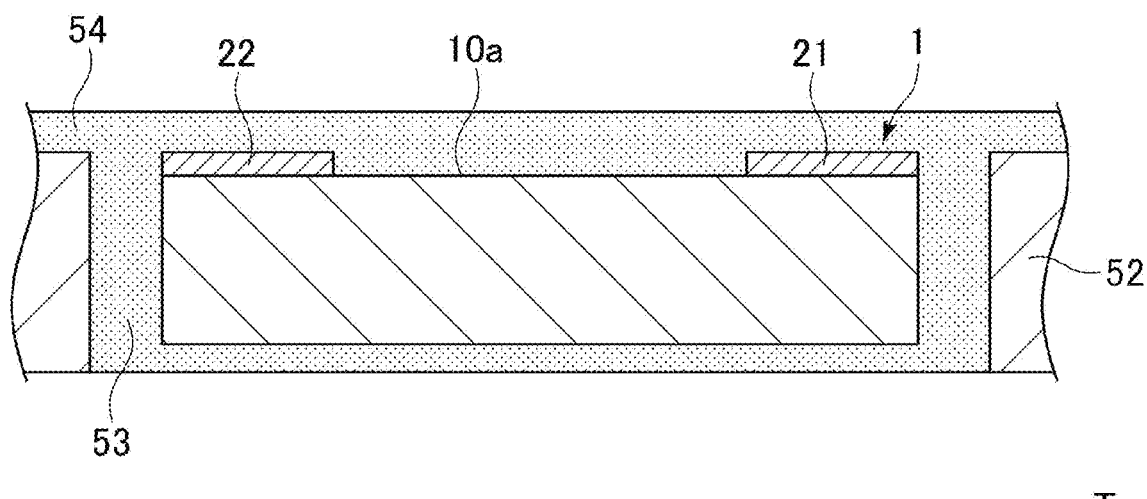
FIG. 3C is a diagram for schematically depicting a part of the process for manufacturing the electronic component incorporated substrate according to the embodiment.

Next, as depicted in FIG. 3C, after the intermediate is inverted vertically, the film 51 is removed, and a second resin layer 54 is formed on the upper surface of the intermediate with the film 51 removed. The second resin layer 54 may include the same thermosetting resin as the first resin layer 53. The second resin layer 54 is formed so as to cover the first external electrode 21 and the second external electrode 22 exposed when the film 51 is removed.

Figure 3D:
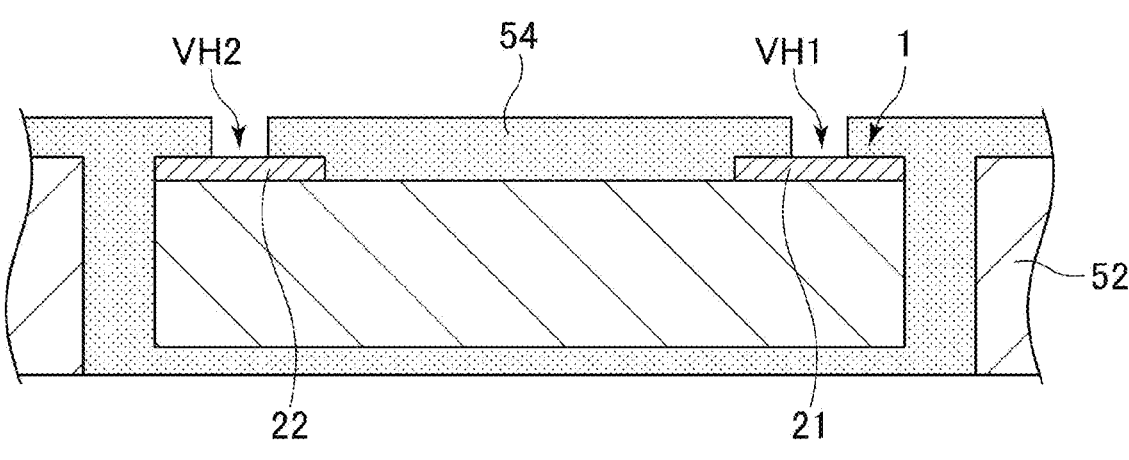
FIG. 3D is a diagram for schematically depicting a part of the process for manufacturing the electronic component incorporated substrate according to the embodiment.
Figure 3D:
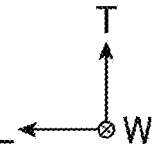

Next, as depicted in FIG. 3D, a first via hole VH1 and a second via hole VH2 are formed in the second resin layer 54 to expose a part of the first external electrode 21 and a part of the second external electrode 22. The first via hole VH1 is formed by irradiating the first external electrode 21 with a laser from above the drawing. Similarly, the second via hole VH2 is formed by irradiating the second external electrode 22 with a laser from above the drawing. The laser to be irradiated is, for example, a carbon dioxide gas laser. By using two carbon dioxide gas laser processing machines, the first external electrode 21 and the second external electrode 22 can be simultaneously irradiated with lasers, and thus the first via hole VH1 and the second via hole VH2 can be formed in parallel. Accordingly, the manufacturing time can be shortened.

Next, as depicted in FIG. 3E, by applying plating treatment to the bottom surface and wall surface defining the first via hole VH1 and the bottom surface and wall surface defining the second via hole VH2, a via conductor 61 is formed in the first via hole VH1 and a via conductor 62 is formed in the second via hole VH2. In addition, by applying plating treatment to the surface of the second resin layer 54, a conductor layer 70 is formed on the surface of the second resin layer 54.

Next, as depicted in FIG. 3F, a region of the conductor layer 70 between the first external electrode 21 and the second external electrode 22 in the L-axis direction is etched to form a first wiring pattern 71 connected to the first external electrode 21 and a second wiring pattern 72 connected to the second external electrode 22.

By the above processes, an electronic component incorporated substrate 81 having the electronic component 1 embedded therein is produced.

The electronic component incorporated substrate 81 may incorporate various electronic components other than the electronic component 1 depicted in the drawing. The electronic components other than the electronic component 1 incorporated in the electronic component incorporated substrate 81 may be passive elements such as an inductor, a capacitor, and a resistor, or active elements such as a semiconductor IC.

The electronic component incorporated substrate 81 can be mounted on various electronic devices. The electronic devices on which the electronic component incorporated substrate 81 can be mounted include smartphones, tablets, game consoles, electric components of an automobile, servers, and various other electronic devices.

1-4 Via Hole Formed by Laser

Next, the formation of the via hole by the laser described in the process of FIG. 3E will be further described with reference to FIG. 4A and FIG. 4B. In the case where a member is irradiated with a laser to form a perforation, the perforation rate by the laser is affected by various factors such as the density of the member to be irradiated with the laser, the roughness of the surface thereof, and the irradiation angle. The perforation rate means the speed at which the depth of the perforation formed when the member is irradiated with the laser increases. In the case where a plurality of perforations is formed in a member by laser irradiation, even if the irradiation conditions of the laser for forming each perforation are set to be the same, it is difficult to equalize the depth of each perforation because the perforation rate of each perforation is different. Therefore, in the past manufacturing method of the electronic component incorporated substrate, it is difficult to equalize the depths of the via holes for exposing a plurality of external electrodes of the incorporated electronic component. For example, even if the irradiation conditions of a plurality of laser machining apparatuses are made the same in order to form via holes and the irradiation of lasers from these laser machining apparatuses to each external electrode is simultaneously started and simultaneously terminated (that is, even if the laser irradiation time for forming each via hole is made the same), the depths of the via holes to be formed are not equalized.

In the electronic component 1 according to the first embodiment, the first inner metal layer 21b having a lower laser absorption rate than the first outer metal layer 21a and the second outer metal layer 22a is provided in the lower layer of the first outer metal layer 21a of the first external electrode 21, and the second inner metal layer 22b having a lower laser absorption rate than the first outer metal layer 21a and the second outer metal layer 22a is provided in the lower layer of the second outer metal layer 22a of the second external electrode 22. When the first external electrode 21 and the second external electrode 22 configured in this manner are irradiated with lasers, the second resin layer 54, the first outer metal layer 21a, and the second outer metal layer 22a easily absorb the energy of the laser, and thus the laser machining proceeds at a high-speed perforation rate until the laser reaches the first inner metal layer 21b or the second inner metal layer 22b. Hereinafter, for the convenience of explanation, the laser with which the first external electrode 21 is irradiated is referred to as a first laser, and the laser with which the second external electrode 22 is irradiated is referred to as a second laser.

When the first laser reaches the first inner metal layer 21b, the perforation rate for the first inner metal layer 21b by the first laser becomes slower because the first inner metal layer 21b has a lower laser absorption rate than the second resin layer 54, the first outer metal layer 21a, and the second outer metal layer 22a. Similarly, when the second laser reaches the second inner metal layer 22b, the perforation rate for the second inner metal layer 22b by the second laser becomes slower because the second inner metal layer 22b has a lower laser absorption rate than the second resin layer 54, the first outer metal layer 21a, and the second outer metal layer 22a. Therefore, by forming the first via hole VH1 so as to penetrate the first outer metal layer 21a and reach the first inner metal layer 21b and forming the second via hole VH2 so as to penetrate the second outer metal layer 22a and reach the second inner metal layer 22b, even if there is a difference between the perforation rate of the first laser and the perforation rate of the second laser at the time of forming the first via hole VH1 and the second via hole VH2, both perforation rates decrease after the first laser reaches the first inner metal layer 21b and after the second laser reaches the second inner metal layer 22b, and thus the depth d1 of the first via hole VH1 and the depth d2 of the second via hole VH2 can be made the same at the end of the laser irradiation. For example, in the case where the perforation rate of the first laser is faster than that of the second laser, the first laser reaches the first inner metal layer 21b before the second laser reaches the second inner metal layer 22b. When the first laser reaches the first inner metal layer 21b, the perforation serving as the first via hole VH1 is perforated deeper than the perforation serving as the second via hole VH2. However, after the first laser reaches the first inner metal layer 21b, the perforation rate of the first laser becomes discontinuously slow according to the difference between the laser absorption rate of the first outer metal layer 21a and the laser absorption rate of the first inner metal layer 21b. Since the laser absorption rate of the first inner metal layer 21b is lower than that of the second outer metal layer 22a, the perforation rate of the first laser becomes slower than that of the second laser after the first laser reaches the first inner metal layer 21b. Therefore, after the first laser reaches the first inner metal layer 21b, the difference between the depth of the perforation serving as the first via hole VH1 and the depth of the perforation serving as the second via hole VH2 is reduced.

As described above, in the electronic component 1 according to the first embodiment, since both the laser absorption rate of the first inner metal layer 21b and the laser absorption rate of the second inner metal layer 22b are lower than the laser absorption rates of both the first outer metal layer 21a and the second outer metal layer 22a, the difference between the depth d1 of the first via hole VH1 and the depth d2 of the second via hole VH2 formed by laser machining becomes smaller than that of the past electronic component without the first inner metal layer 21b and the second inner metal layer 22b. Therefore, in the electronic component 1 according to the first embodiment, the depth of the first via hole VH1 and the depth of the second via hole VH2 can be equalized.

In the electronic component 1, it was confirmed as follows that the first external electrode 21 included the first inner metal layer 21b and the second external electrode 22 included the second inner metal layer 22b so that the difference between the depth of the first via hole VH1 and the depth of the second via hole VH2 formed by laser machining when the electronic component 1 was incorporated into the electronic component incorporated substrate could be reduced. First, a first lamination part having an Ag film having a thickness of 1.5 μm and a Cu film having a thickness of 7.5 μm formed on the surface of the Ag film was formed on the surface of an insulator, and a second lamination part having an Ag film having a thickness of 1.5 μm and a Cu film having a thickness of 7.5 μm formed on the surface of the Ag film was formed at a position apart from the first lamination part on the surface of the insulator to obtain a sample. The first lamination part of the sample corresponds to the first external electrode 21 of the electronic component 1, and the Cu film and Ag film of the first lamination part correspond to the first outer metal layer 21a and the first inner metal layer 21b, respectively. In addition, the second lamination part of the sample corresponds to the second external electrode 22 of the electronic component 1, and the Cu film and Ag film of the second lamination part correspond to the second outer metal layer 22a and the second inner metal layer 22b, respectively.

Figure 5:
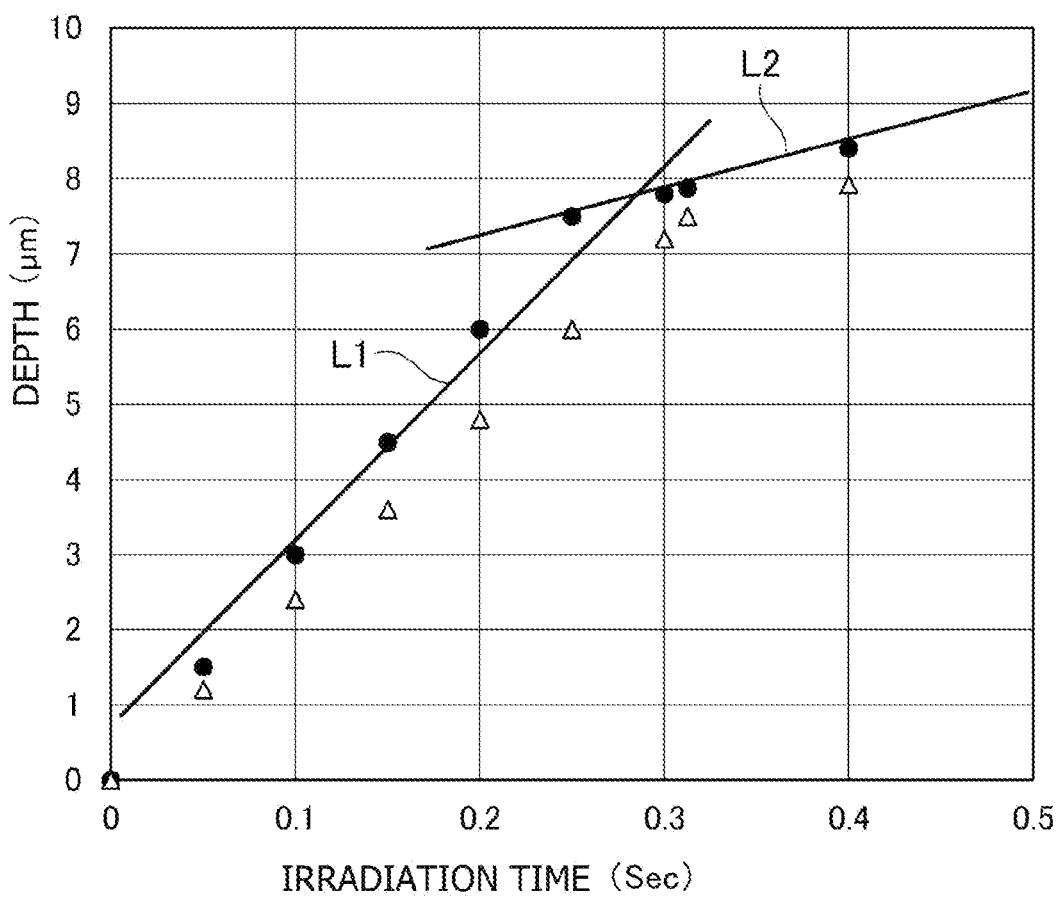
FIG. 5 is a graph for depicting a relation between a depth $d1$ and a depth $d2$ from the start of laser machining.

Each of the first lamination part and the second lamination part was simultaneously irradiated with a carbon dioxide gas laser. The depths of perforations formed in the first lamination part and the second lamination part were measured every 0.05 seconds after the start of irradiation of the carbon dioxide gas laser, and the measured depths were plotted on the graph of FIG. 5. In FIG. 5, the horizontal axis represents the elapsed time from the start of laser irradiation, and the vertical axis represents the depth of the perforation.

From the result of FIG. 5, it can be understood that the perforation rate of the first laser with which the first lamination part is irradiated is faster than that of the laser with which the second lamination part is irradiated. From the difference in the perforation rate, until the depth of the perforation formed in the first lamination part reaches 7.5 μm (that is, until the first laser penetrates the Cu film having a thickness of 7.5 μm), the difference between the depth of the perforation formed in the first lamination part and the depth of the perforation formed in the second lamination part increases with the passage of time from the start of laser irradiation. On the other hand, after the depth of the perforation formed in the first lamination part reaches 7.5 μm, the perforation rate by the first laser decreases because the first laser is incident on the Ag film. The fact that the perforation rate decreases after the depth of the perforation formed in the first lamination part reaches 7.5 μm can be understood from the fact that the inclination of the line L2 obtained by fitting the plots located in the range where the depths of the perforations are larger than 7.5 μm is smaller than the inclination of the line L1 obtained by fitting the plots located in the range where the depths of the perforations are 7.5 μm or less.

When the first laser reaches the Ag film, the second laser with which the second lamination part is irradiated has not reached the Ag film of the second lamination part, and thus the perforation rate of the second lamination part by the second laser does not change. Since the second laser reached the Ag film of the second lamination part at 0.3125 seconds after the start of irradiation, the depth of the perforation when 0.3125 seconds elapsed was also plotted in FIG. 5. From the graph of FIG. 5, it can be understood that the difference between the depth of the perforation in the first lamination part and the depth of the perforation formed in the second lamination part was reduced from 0.25 seconds after the start of irradiation when the depth of the perforation formed in the first lamination part reached 7.5 μm to 0.3125 seconds when the depth of the perforation formed in the second lamination part reached 7.5 μm.

If the Ag films corresponding to the first inner metal layer 21b and the second inner metal layer 22b of the electronic component 1 are not provided in the first lamination part and the second lamination part, the depth of the perforation formed in the first lamination part and the depth of the perforation formed in the second lamination part increase as the laser irradiation time becomes longer, as observed in the region where the perforation is 7.5 μm or less. Therefore, the difference between the depth of the perforation in the first lamination part and the depth of the perforation formed in the second lamination part was reduced because the Ag films corresponding to the first inner metal layer 21b and the second inner metal layer 22b of the electronic component 1 were provided in the first lamination part and the second lamination part, respectively.

As described above, it was confirmed in the electronic component 1 that the first external electrode 21 included the first inner metal layer 21b and the second external electrode 22 included the second inner metal layer 22b so that the difference between the depth of the first via hole VH1 and the depth of the second via hole VH2 formed by laser machining when the electronic component 1 was incorporated into the electronic component incorporated substrate could be reduced, that is, the depth of the first via hole VH1 and the depth of the second via hole VH2 could be equalized.

2. Second Embodiment

Figure 6:
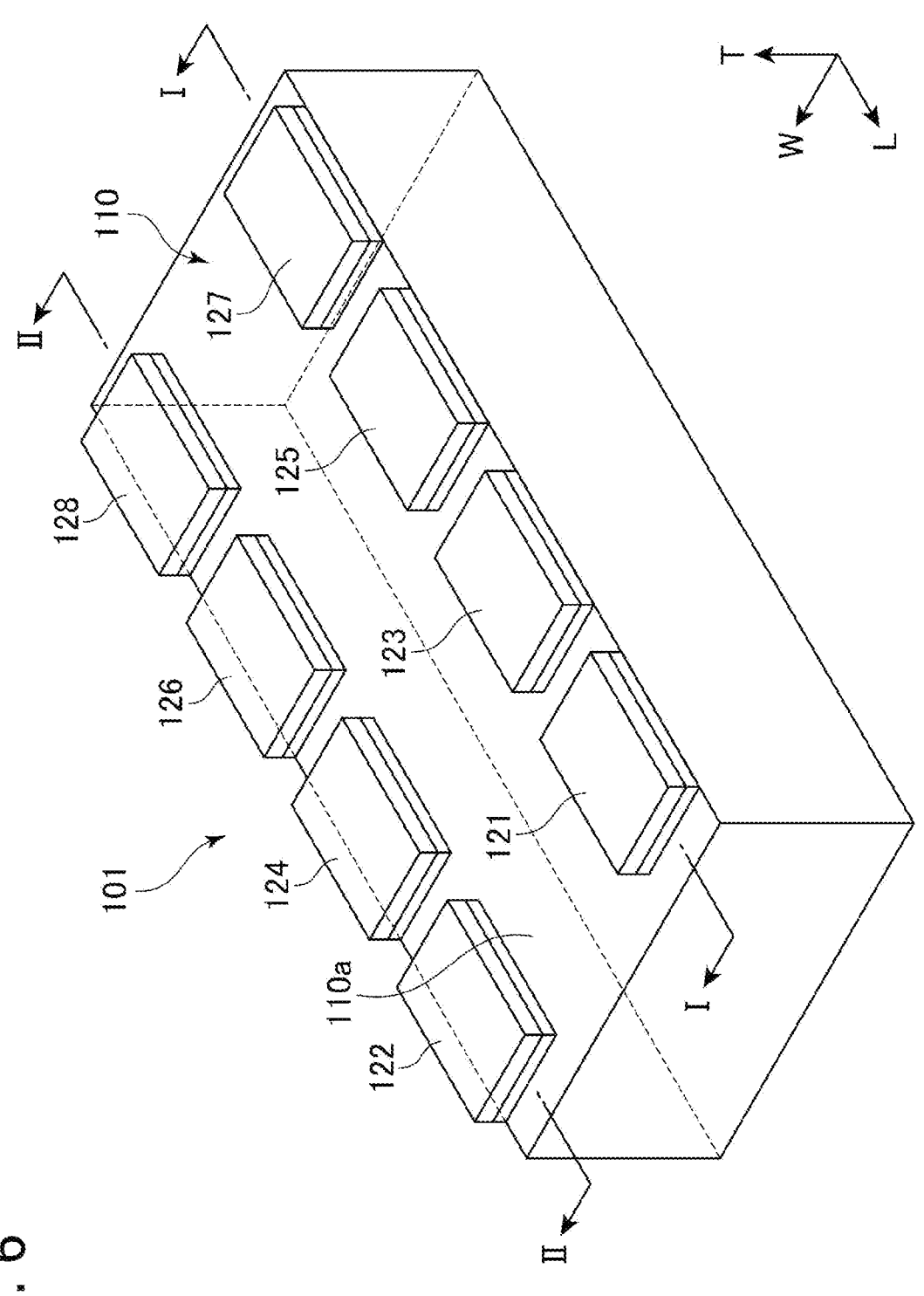
FIG. 6 is a perspective view for schematically depicting an electronic component according to another embodiment.
Figure 7:
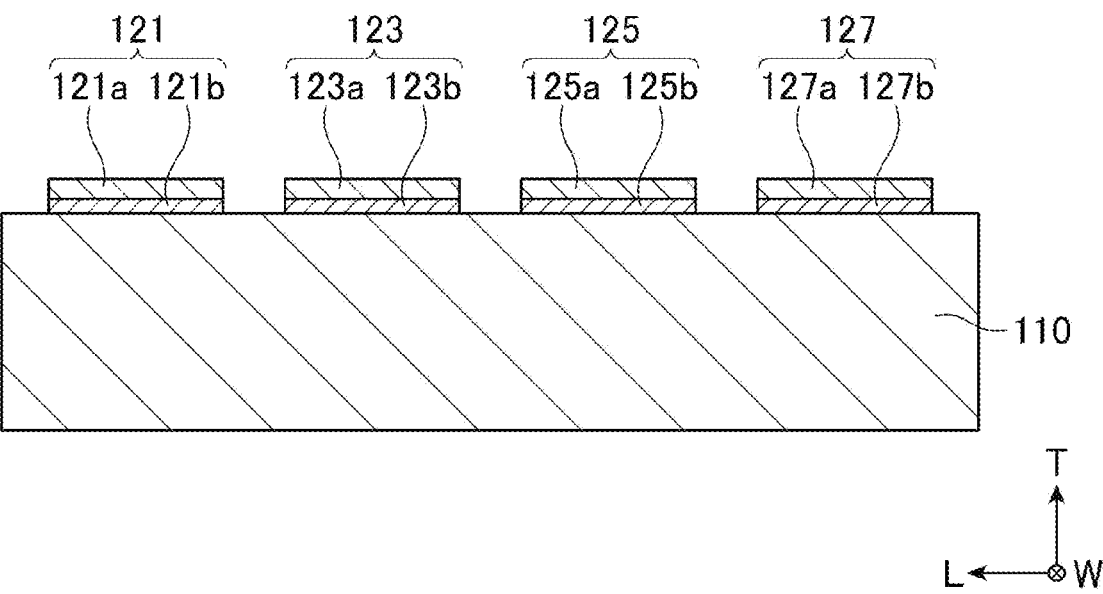
FIG. 7 is a cross-sectional view for depicting an enlarged portion of a cross section of the electronic component of FIG. 6 cut along the line I-I.
Figure 8:
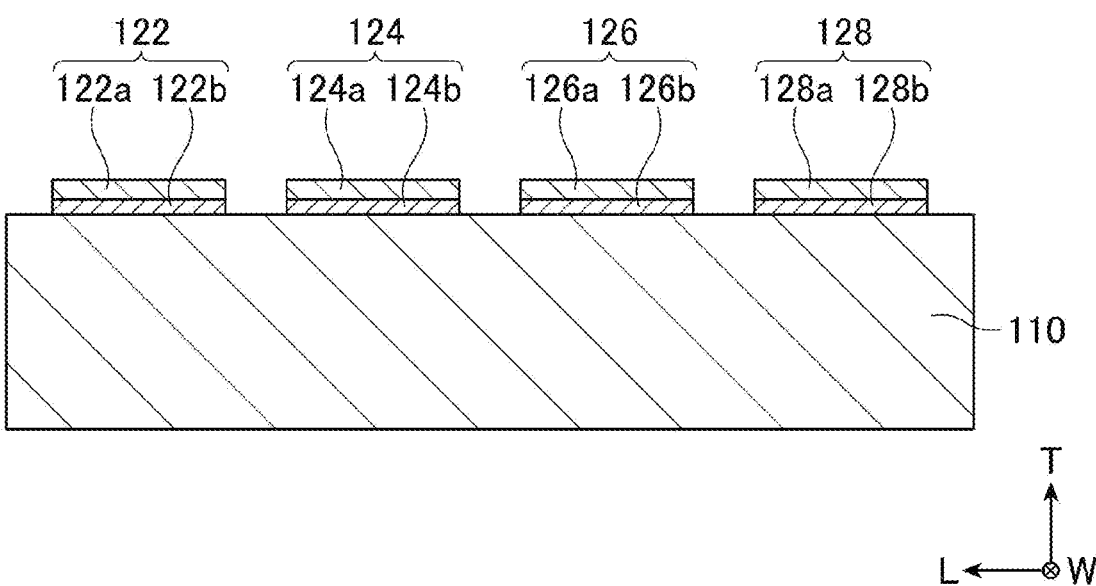
FIG. 8 is a cross-sectional view for depicting an enlarged portion of a cross section of the electronic component of FIG. 6 cut along the line II-II.

Next, an electronic component 101 according to a second embodiment will be described with reference to FIG. 6 to FIG. 8. FIG. 6 is a perspective view of the electronic component 101 according to the second embodiment, FIG. 7 is a cross-sectional view of the electronic component 101 cut along the I-I line, and FIG. 8 is a cross-sectional view of the electronic component 101 cut along the II-II line. The electronic component 101 is different from the electronic component 1 having two external electrodes in that the electronic component 101 has eight external electrodes 121 to 128.

The electronic component 101 is, for example, an array-type element in which a plurality of elements is packaged inside an insulator 110. In the array-type element, since the plurality of elements is packaged as one element, the mounting space for mounting the plurality of elements can be reduced. In the electronic component 101, different types of elements may be packaged. For example, the electronic component 101 may be configured by packaging four elements selected from LC filters, LCR filters, and inductors inside the insulator 110. The electronic component 101 may be configured by packaging four elements of the same type inside the insulator 110. For example, the electronic component 101 may be an array-type inductor in which four inductor elements are packaged. The electronic component 101 may include an element connected to more than two external electrodes, for example, a magnetically coupled inductor (for example, a common-mode choke coil).

Each of the external electrodes 121 to 128 may be in contact with only an upper surface 110a of the outer surface of the insulator 110.

The external electrode 121 is connected to one end of a first internal element, which is not depicted in the drawing, and the external electrode 122 is connected to the other end of the first internal element. In the case where the electronic component 101 is an array-type inductor, the first internal element is a first coil conductor. The external electrode 121 has an outer metal layer 121a and an inner metal layer 121b arranged between the outer metal layer 121a and the first internal element. The external electrode 122 has an outer metal layer 122a and an inner metal layer 122b arranged between the outer metal layer 122a and the first internal element.

The external electrode 123 is connected to one end of a second internal element, which is not depicted in the drawing, and the external electrode 124 is connected to the other end of the second internal element. In the case where the electronic component 101 is an array-type inductor, the second internal element is a second coil conductor. The external electrode 123 has an outer metal layer 123a and an inner metal layer 123b arranged between the outer metal layer 123a and the second internal element. The external electrode 124 has an outer metal layer 124a and an inner metal layer 124b arranged between the outer metal layer 124a and the second internal element.

The external electrode 125 is connected to one end of a third internal element, which is not depicted in the drawing, and the external electrode 126 is connected to the other end of the third internal element. In the case where the electronic component 101 is an array-type inductor, the third internal element is a third coil conductor. The external electrode 125 has an outer metal layer 125a and an inner metal layer 125b arranged between the outer metal layer 125a and the third internal element. The external electrode 126 has an outer metal layer 126a and an inner metal layer 126b arranged between the outer metal layer 126a and the third internal element.

The external electrode 127 is connected to one end of a fourth internal element, which is not depicted in the drawing, and the external electrode 128 is connected to the other end of the fourth internal element. In the case where the electronic component 101 is an array-type inductor, the fourth internal element is a fourth coil conductor. The external electrode 127 has an outer metal layer 127a and an inner metal layer 127b arranged between the outer metal layer 127a and the fourth internal element. The external electrode 128 has an outer metal layer 128a and an inner metal layer 128b arranged between the outer metal layer 128a and the fourth internal element.

The laser absorption rate of each of the inner metal layers 121b to 128b of the external electrodes 121 to 128 is lower than the laser absorption rate of each of the outer metal layers 121a to 128a of the external electrodes 121 to 128.

The description related to the first outer metal layer 21a of the first embodiment applies to each of the outer metal layers 121a to 128a of the external electrodes 121 to 128. For example, each of the outer metal layers 121a to 128a contains Cu as a main component. In addition, the description related to the first inner metal layer 21b of the first embodiment applies to each of the inner metal layers 121b to 128b of the external electrodes 121 to 128. For example, each of the inner metal layers 121b to 128b contains Ag as a main component.

Similarly to the electronic component 1, the electronic component 101 is mounted in the electronic component incorporated substrate through the processes depicted in FIG. 3A to FIG. 3F. In order to form via conductors for electrically connecting the external electrodes 121 to 128 of the electronic component 101 to wiring patterns, it is necessary to form eight via holes that expose each of the external electrodes 121 to 128 by laser irradiation. It has been difficult from the past to equalize the depths of eight via holes formed by laser machining, but since the external electrodes 121 to 128 have the inner metal layers 121b to 128b and the laser absorption rate of each of the inner metal layers 121b to 128b is lower than that of any of the outer metal layers 121a to 128a, it is possible to equalize the depths of the eight via holes formed by laser machining when the electronic component incorporated substrate in which the electronic component 101 is incorporated is manufactured.

3 Notes

The dimension, material, and arrangement of each of the constitutional elements described in the various embodiments described above are not limited to those explicitly described in each embodiment, and each of the constitutional elements may be modified to have a given dimension, material, and arrangement that may fall within the scope of the present technology.

Constitutional elements that are not explicitly described in the specification can be added to each of the embodiments described above, or some of the constitutional elements described in each embodiment can be omitted.

Notations such as "first," "second," and "third" in the specification and the like are added to identify the constitutional elements from each other and do not necessarily limit the number, order, or content thereof. In addition, numbers for identifying the constitutional elements from each other are used for each context, and a number used in one context does not necessarily indicate the same configuration in other contexts. In addition, a constitutional element identified by one number is not prevented from functioning as a constitutional element identified by another number.

In the specification, "including" a constitutional element means that other constitutional elements can be further included, rather than excluding the other constitutional elements unless inconsistent with the content of the present technology.

4. Note

The embodiments disclosed in the specification also include the following matters.

[Note 1]

An electronic component including:

a base body;

a first internal element that is provided inside the base body;

a first external electrode that is provided on the base body and electrically connected to the first internal element; and a second external electrode that is provided on the base body so as to be separated from the first external electrode and electrically connected to the first internal element, in which the first external electrode has a first outer metal layer, and a first inner metal layer that is provided between the first outer metal layer and the first internal element, the second external electrode has a second outer metal layer, and a second inner metal layer that is provided between the second outer metal layer and the first internal element, and the first inner metal layer has a lower laser absorption rate than any of the first outer metal layer and the second outer metal layer, and the second inner metal layer has a lower laser absorption rate than any of the first outer metal layer and the second outer metal layer.

[Note 2]

The electronic component according to [Note 1], in which the first inner metal layer is in direct contact with the first outer metal layer, and the second inner metal layer is in direct contact with the second outer metal layer.

[Note 3]

The electronic component according to [Note 1] or [Note 2], in which a thickness of the first inner metal layer is 0.2 times or more and 3.0 times or less of a thickness of the first outer metal layer.

[Note 4]

The electronic component according to any one of [Note 1] to [Note 3], in which the first outer metal layer contains Cu as a main component, and the first inner metal layer contains Ag as a main component.

[Note 5]

The electronic component according to any one of [Note 1] to [Note 4], in which the base body has a first surface, and both the first inner metal layer and the second inner metal layer are in contact with the first surface.

[Note 6]

The electronic component according to any one of [Note 1] to [Note 5], further including:

a second internal element that is provided inside the base body while being separated from the first internal element;

a third external electrode that is provided on the base body so as to be separated from the first external electrode and the second external electrode and electrically connected to the second internal element; and a fourth external electrode that is provided on the base body so as to be separated from the first external electrode, the second external electrode, and the third external electrode and electrically connected to the second internal element, in which the third external electrode has a third outer metal layer, and a third inner metal layer that is provided between the third outer metal layer and the second internal element, the fourth external electrode has a fourth outer metal layer, and a fourth inner metal layer that is provided between the fourth outer metal layer and the second internal element, the first inner metal layer has a lower laser absorption rate than any of the first outer metal layer, the second outer metal layer, the third outer metal layer, and the fourth outer metal layer, the second inner metal layer has a lower laser absorption rate than any of the first outer metal layer, the second outer metal layer, the third outer metal layer, and the fourth outer metal layer, the third inner metal layer has a lower laser absorption rate than any of the first outer metal layer, the second outer metal layer, the third outer metal layer, and the fourth outer metal layer, and the fourth inner metal layer has a lower laser absorption rate than any of the first outer metal layer, the second outer metal layer, the third outer metal layer, and the fourth outer metal layer.

[Note 7]

The electronic component according to [Note 6], in which the base body has a first surface, and all of the first external electrode, the second external electrode, the third external electrode, and the fourth external electrode are in contact with the base body only on the first surface.

[Note 8]

A manufacturing method of an electronic component incorporated substrate, the method including:

a step of placing the electronic component according to claim 1 in a cavity formed in an insulating layer;

a step of forming a resin layer so as to cover the electronic component; and a step of irradiating the first external electrode and the second external electrode with lasers such that a first via hole penetrating the first outer metal layer is formed in the first external electrode and a second via hole penetrating the second outer metal layer is formed in the second external electrode.

[Note 9]

The manufacturing method according to [Note 8], further including:

a step of forming a first via conductor in the first via hole and forming a second via conductor in the second via hole.

[Note 10]

The manufacturing method according to [Note 9], in which the first via conductor and the second via conductor are formed by plating treatment.

What is claimed is:

1. An electronic component comprising: a base body; a first internal element that is provided inside the base body; a first external electrode that is provided on the base body and electrically connected to the first internal element; and a second external electrode that is provided on the base body so as to be separated from the first external electrode and electrically connected to the first internal element, wherein the first external electrode has a first outer metal layer, and a first inner metal layer that is provided between the first outer metal layer and the first internal element, the second external electrode has a second outer metal layer, and a second inner metal layer that is provided between the second outer metal layer and the first internal element, and the first inner metal layer has a lower laser absorption rate than any of the first outer metal layer and the second outer metal layer, and the second inner metal layer has a lower laser absorption rate than any of the first outer metal layer and the second outer metal layer; and a second internal element that is provided inside the base body while being separated from the first internal element; a third external electrode that is provided on the base body so as to be separated from the first external electrode and the second external electrode and electrically connected to the second internal element; and a fourth external electrode that is provided on the base body so as to be separated from the first external electrode, the second external electrode, and the third external electrode and electrically connected to the second internal element, wherein the third external electrode has a third outer metal layer, and a third inner metal layer that is provided between the third outer metal layer and the second internal element, the fourth external electrode has a fourth outer metal layer, and a fourth inner metal layer that is provided between the fourth outer metal layer and the second internal element, the first inner metal layer has a lower laser absorption rate than any of the first outer metal layer, the second outer metal layer, the third outer metal layer, and the fourth outer metal layer, the second inner metal layer has a lower laser absorption rate than any of the first outer metal layer, the second outer metal layer, the third outer metal layer, and the fourth outer metal layer, the third inner metal layer has a lower laser absorption rate than any of the first outer metal layer, the second outer metal layer, the third outer metal layer, and the fourth outer metal layer, and the fourth inner metal layer has a lower laser absorption rate than any of the first outer metal layer, the second outer metal layer, the third outer metal layer, and the fourth outer metal layer.

2. The electronic component according to claim 1, wherein the first inner metal layer is in direct contact with the first outer metal layer, and the second inner metal layer is in direct contact with the second outer metal layer.

3. The electronic component according to claim 1, wherein a thickness of the first inner metal layer is 0.2 times or more and 3.0 times or less of a thickness of the first outer metal layer.

4. The electronic component according to claim 1, wherein the first outer metal layer contains Cu as a main component, and the first inner metal layer contains Ag as a main component.

5. The electronic component according to claim 1, wherein the base body has a first surface, and both the first inner metal layer and the second inner metal layer are in contact with the first surface.

6. The electronic component according to claim 1, wherein the base body has a first surface, and all of the first external electrode, the second external electrode, the third external electrode, and the fourth external electrode are in contact with the base body only on the first surface.

7. The electronic component according to claim 1, wherein surfaces of the first external electrode and the second external electrode are processed by laser machining, and the laser wavelength is in a range of 0.5 to 15 μm.

* * * * *